(12) United States Patent
Numata

(10) Patent No.: US 9,443,891 B2
(45) Date of Patent: Sep. 13, 2016

(54) SOLID-STATE IMAGE SENSOR AND IMAGING DEVICE

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/618,798

(22) Filed: Feb. 10, 2015

(65) Prior Publication Data

US 2015/0228687 A1    Aug. 13, 2015

(30) Foreign Application Priority Data

Feb. 13, 2014  (JP) .................................. 2014-025835

(51) Int. Cl.
*H01L 27/146*    (2006.01)
*H01L 31/113*    (2006.01)

(52) U.S. Cl.
CPC ..... *H01L 27/1461* (2013.01); *H01L 27/14607* (2013.01); *H01L 27/14627* (2013.01); *H01L 27/14629* (2013.01)

(58) Field of Classification Search
CPC .................. H01L 27/14629; H01L 27/14627; H01L 27/14632
USPC .......................................... 348/340; 257/436
See application file for complete search history.

(56) References Cited

U.S. PATENT DOCUMENTS

| 2009/0072337 | A1* | 3/2009 | Lee ................................. 257/440 |
| 2010/0230578 | A1* | 9/2010 | Horikoshi et al. ......... 250/208.1 |
| 2012/0194714 | A1* | 8/2012 | Yamashita .................... 348/294 |
| 2012/0199893 | A1* | 8/2012 | Okabe et al. ................. 257/291 |

FOREIGN PATENT DOCUMENTS

| JP | 2009-158800 A | 7/2009 |
| JP | 2010-182765 A | 8/2010 |

* cited by examiner

*Primary Examiner* — Whitney T Moore
*Assistant Examiner* — Changhyun Yi
(74) *Attorney, Agent, or Firm* — Canon USA, Inc. I.P. Division

(57) ABSTRACT

A ranging pixel located in a peripheral region of a solid-state image sensor includes a microlens having a center axis that is shifted relative to a center axis of the ranging pixel, a first photoelectric conversion unit, and a second photoelectric conversion unit. The first photoelectric conversion unit is disposed on a side of the center axis of the ranging pixel that is in a direction opposite to a direction (projection shift direction) obtained by projecting a shift direction of the microlens onto a straight line connecting a center of the first photoelectric conversion unit and a center of the second photoelectric conversion unit, and the second photoelectric conversion unit is disposed on another side of the center axis of the ranging pixel that is in a direction identical to the projection shift direction of the microlens. In addition, the area of the first photoelectric conversion unit is greater than the area of the second photoelectric conversion unit.

24 Claims, 11 Drawing Sheets

FIG. 1
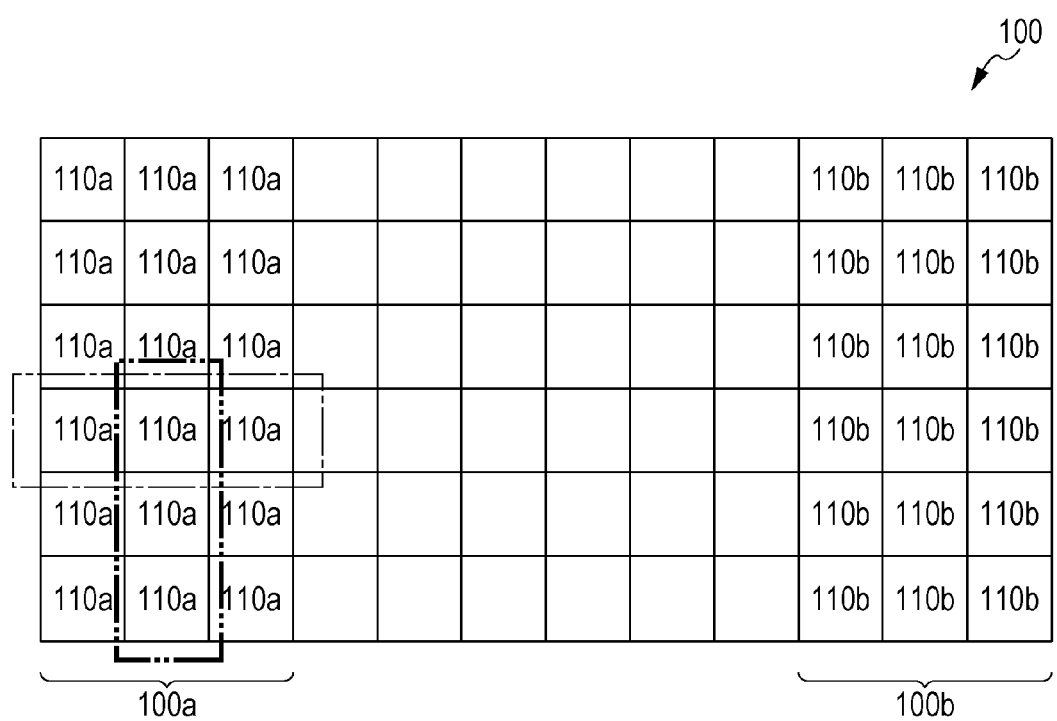
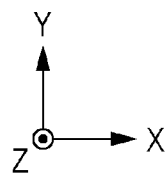

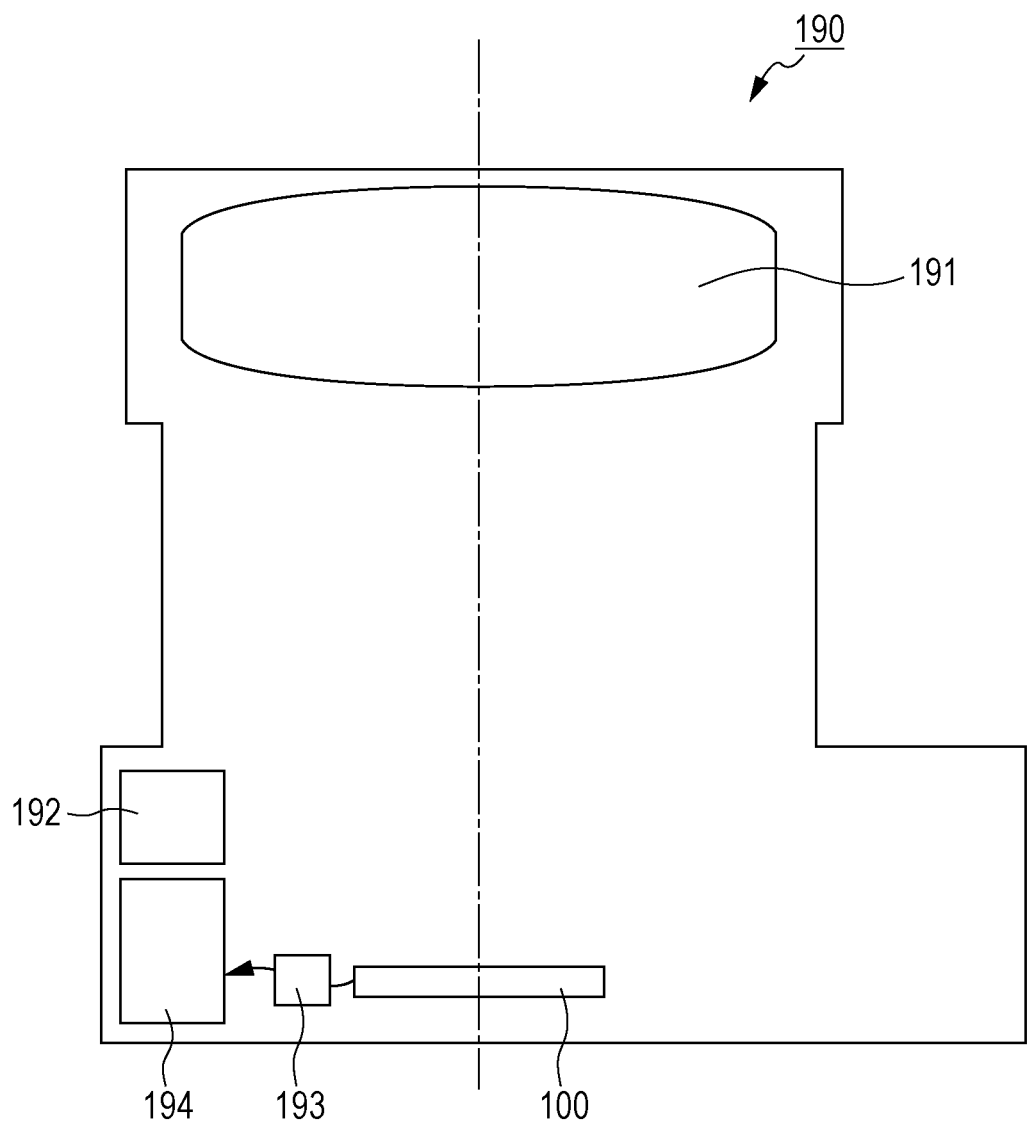

SOLID-STATE IMAGE SENSOR AND IMAGING DEVICE

BACKGROUND OF THE INVENTION

1. Field of the Invention

The present invention relates to solid-state image sensors and image-capturing devices that include solid-state image sensors.

2. Description of the Related Art

Nowadays, in order to reduce the size of digital cameras, there is a demand for solid-state image sensors that are compatible with camera lenses having a short back focus. In addition, in order to broaden the dynamic range of digital cameras, large-size solid-state image sensors are being used even in small-size digital cameras. In digital cameras that meet the aforementioned demands, light beams are incident on pixels in peripheral regions of the solid-state image sensors at large angles, and thus the light beams are incident on the pixels at positions that are shifted from photoelectric conversion units disposed in the pixels. Consequently, the utilization efficiency of the light beams are reduced, and the sensitivity of the pixels in the peripheral regions decreases.

To address such an issue, Japanese Patent Laid-Open No. 2010-182765 discloses a solid-state image sensor in which microlenses provided on the surface of the pixels are disposed so as to be shifted toward the center of the solid-state image sensor, and the solid-state image sensor is thus capable of detecting light beams incident on the pixels at an angle with high efficiency.

Meanwhile, techniques for detecting a focal point in digital cameras are known. With regard to such techniques, Japanese Patent Laid-Open No. 2009-158800 discloses a solid-state image sensor in which some of the pixels in the solid-state image sensor are provided with a configuration for detecting a focal point through a phase-difference method. In the phase-difference method, images of light rays that have passed through different regions in a pupil of an imaging optical system are compared, and the distance from the focal point to a target of imaging is determined by triangulation of a stereo image. With the technique disclosed in Japanese Patent Laid-Open No. 2009-158800, light beams that have passed through different regions in the pupil of the imaging optical system are coupled, by using microlenses, on interlayer films that are spaced apart from each other. The light beams that have been incident on the interlayer films that are spaced apart from each other are then guided to respective photoelectric conversion units, and the distance is determined on the basis of electric signals from the photoelectric conversion units.

Even with a solid-state image sensor such as the one disclosed in Japanese Patent Laid-Open No. 2009-158800, there arises a problem in that the sensitivity in the peripheral region decreases when the back focus is shortened or the dynamic range is broadened. To address such an issue, employing a technique in which the microlenses are disposed so as to be shifted toward the center of the solid-state image sensor, as disclosed in Japanese Patent Laid-Open No. 2010-182765, is considered.

However, if the technique disclosed in Japanese Patent Laid-Open No. 2010-182765 is merely applied to the technique disclosed in Japanese Patent Laid-Open No. 2009-158800, another problem as described below arises. Specifically, in a case in which a microlens is disposed so as to be shifted, angles at which principal rays enter respective waveguides differ from each other, and thus coupling efficiencies of the light beams incident on a pixel differ among the plurality of waveguides. Therefore, a difference is produced among the sensitivities of photoelectric conversion units corresponding to the respective waveguides in the pixel, and thus the accuracy in measuring the distance through the phase-difference method is deteriorated.

The present invention is directed to providing a solid-state image sensor that is capable of measuring a distance with high accuracy even in a peripheral region of the solid-state image sensor.

SUMMARY OF THE INVENTION

The present invention provides a solid-state image sensor that includes one or more ranging pixels, and the one or more ranging pixels each include a microlens, a plurality of photoelectric conversion units, and a plurality of waveguides disposed between the microlens and the plurality of photoelectric conversion units so as to correspond to the plurality of photoelectric conversion units. In at least one ranging pixel located in a peripheral region of the solid-state image sensor, the microlens is so disposed that a center axis thereof is shifted relative to a center axis of the ranging pixel, the plurality of photoelectric conversion units include a first photoelectric conversion unit and a second photoelectric conversion unit, the first photoelectric conversion unit is disposed on a side of the center axis of the ranging pixel that is in a direction opposite to a direction obtained by projecting a shift direction of the microlens onto a straight line connecting a center of the first photoelectric conversion unit and a center of the second photoelectric conversion unit, the second photoelectric conversion unit is disposed on another side of the center axis of the ranging pixel that is in a direction identical to the direction obtained by projecting the shift direction of the microlens onto the straight line, and an area of the first photoelectric conversion unit is greater than an area of the second photoelectric conversion unit.

In addition, the present invention provides a solid-state image sensor that includes one or more ranging pixels, and the one or more ranging pixels each include a microlens, a plurality of photoelectric conversion units, and a plurality of waveguides disposed between the microlens and the plurality of photoelectric conversion units so as to correspond to the plurality of photoelectric conversion units. In at least one ranging pixel located in a peripheral region of the solid-state image sensor, the microlens is so disposed that a center axis thereof is shifted relative to a center axis of the ranging pixel, the plurality of photoelectric conversion units include a first photoelectric conversion unit and a second photoelectric conversion unit, the first photoelectric conversion unit is disposed on a side of the center axis of the ranging pixel that is in a direction opposite to a direction obtained by projecting a shift direction of the microlens onto a straight line connecting a center of the first photoelectric conversion unit and a center of the second photoelectric conversion unit, and the second photoelectric conversion unit is disposed on another side of the center axis of the ranging pixel that is in a direction identical to the direction obtained by projecting the shift direction of the microlens onto the straight line. The solid-state image sensor further includes at least one of a first electrode to which a bias serving as attractive force between the first electrode and a carrier accumulated in the first photoelectric conversion unit is applied and a second electrode to which a bias serving as repulsive force between the second electrode and the carrier is applied.

Further features of the present invention will become apparent from the following description of exemplary embodiments with reference to the attached drawings.

BRIEF DESCRIPTION OF THE DRAWINGS

FIG. 1 is a schematic diagram illustrating an example of a solid-state image sensor according to a first exemplary embodiment.

FIG. 10 is a schematic diagram illustrating an example of an image-capturing device according to a fourth exemplary embodiment.

DESCRIPTION OF THE EMBODIMENTS

Figure 2A:
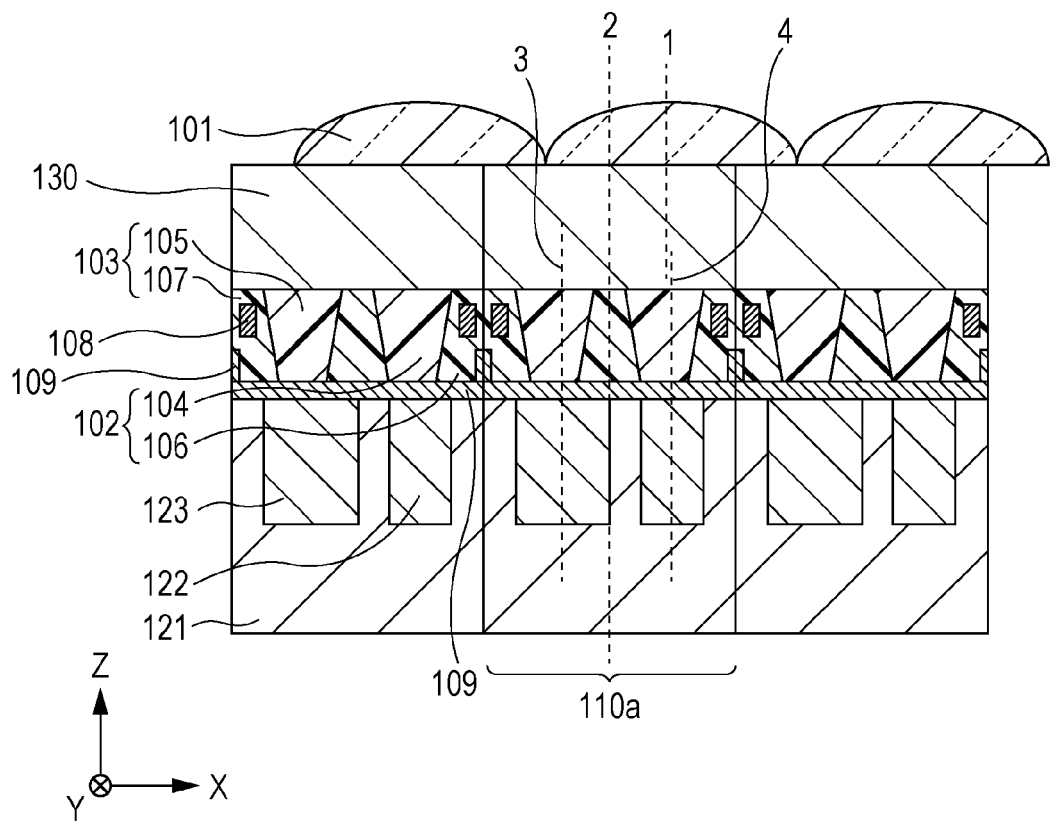
FIGS. 2A and 2B are schematic diagrams illustrating an example of ranging pixels according to the first exemplary embodiment.

Hereinafter, solid-state image sensors according to exemplary embodiments of the present invention will be described with reference to the drawings. Elements having identical functions are given identical reference characters in the drawings, and repeated descriptions thereof will be omitted.

First Exemplary Embodiment

FIG. 1 illustrates a configuration of ranging pixels in a solid-state image sensor 100 according to the present exemplary embodiment. A ranging pixel is a region that is allocated so as to dispose thereon a set of components, such as a photoelectric conversion unit for obtaining a signal for measuring a distance and an element for outputting a signal, necessary for measuring a distance, and is a region that serves as a repeating unit for disposing such components. Ranging pixels 110a are disposed in a peripheral region 100a of the solid-state image sensor 100, and the peripheral region 100a is located to the left side on the paper plane. Meanwhile, ranging pixels 110b are disposed in a peripheral region 100b of the solid-state image sensor 100, and the peripheral region 100b is located to the right side on the paper plane. With regard to a pixel that does not have the reference character 110a or 110b assigned thereto, a ranging pixel may be provided on such a pixel, or a normal image-capturing pixel may be provided on such a pixel. Here, a normal image-capturing pixel is a region that is allocated so as to dispose thereon a set of components, such as a photoelectric conversion unit for obtaining a signal for capturing an image and an element for outputting a signal, necessary for capturing an image, and is a region that serves as a repeating unit for disposing such components. The ranging pixels and the image-capturing pixels may be in the same size or may be in different sizes. The ranging pixels and the image-capturing pixels will be described later. In FIG. 1, the X-direction corresponds to the lengthwise direction of the solid-state image sensor 100, and the Y-direction corresponds to the widthwise direction of the solid-state image sensor 100. The Z-direction corresponds to a direction that is perpendicular to both the X-direction and the Y-direction.

Figure 2B:
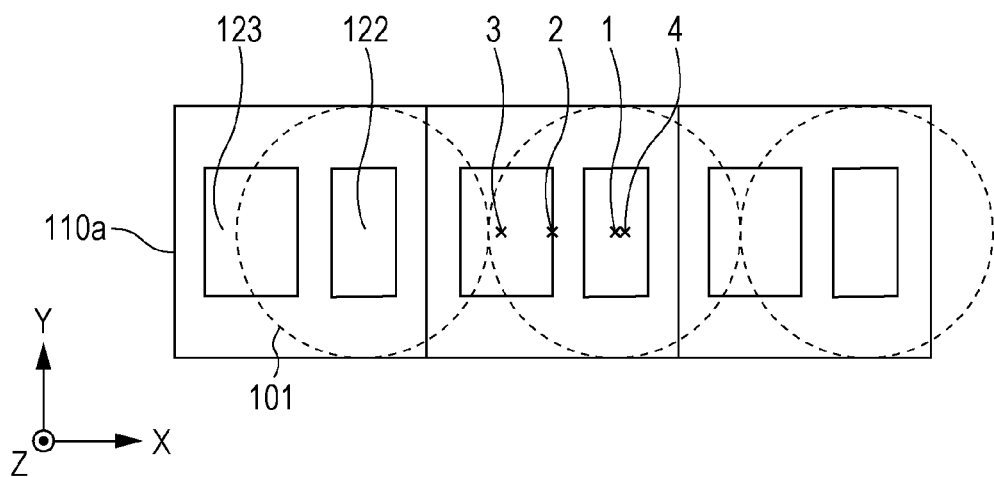

FIGS. 2A and 2B illustrate a configuration of components provided in the three ranging pixels 110a, enclosed by the dashed-dotted line in FIG. 1, located in the peripheral region 100a of the solid-state image sensor 100 illustrated in FIG. 1. FIG. 2A is a schematic sectional view of the three ranging pixels 110a taken along the XZ-plane. In each of the ranging pixels 110a, a microlens 101, a plurality of waveguides 102 and 103, and a plurality of photoelectric conversion units 122 and 123 formed inside a substrate 121 are disposed from a side on which light is incident on the ranging pixel 110a. FIG. 2B is a schematic plan view of the three ranging pixels 110a along the XY-plane indicated in FIG. 1. The waveguides 103 and 102 are arrayed in this order in the +X-direction. In a similar manner, the photoelectric conversion units 123 and 122 are arrayed in this order in the +X-direction.

The microlens 101 selectively guides light beams passing through different regions in an exit pupil of an imaging optical system (not illustrated) to the respective waveguides 102 and 103. The light beams that have entered the waveguides 102 and 103 are guided, respectively, to the corresponding photoelectric conversion units 122 and 123, and are then converted to electric signals. The electric signals are then transmitted to a signal processing unit (not illustrated) through wires 108 that enclose the ranging pixel 110a. Then, a positional shift amount between an image obtained from the electric signal that has been converted by the photoelectric conversion unit 122 and an image obtained from the electric signal that has been converted by the photoelectric conversion unit 123 is obtained, and thus the distance to the target of imaging can be calculated on the basis of the triangulation principle.

As illustrated in FIGS. 2A and 2B, the microlens 101 in the ranging pixel 110a is so disposed that a center axis 1 of the microlens 101 is shifted relative to a center axis 2 of the ranging pixel 110a. Specifically, the center axis 1 of the microlens 101 is shifted in the +X-direction relative to the center axis 2 of the ranging pixel 110a. Here, the center axis 1 of the microlens 101 corresponds to the optical axis of the microlens 101. In addition, the center axis 2 of the ranging pixel 110a corresponds to an axis that passes through the center of the ranging pixel 110a and that is parallel to the Z-axis. Hereinafter, a direction in which the center axis 1 of the microlens 101 is shifted relative to the center axis 2 of the ranging pixel 110a is referred to as a shift direction of the microlens 101. It is to be noted that the microlenses 101 are so disposed that their center axes 1 are shifted relative to the respective center axes 2 of the ranging pixels 110a located in the peripheral region 100a of the solid-state image sensor 100 in order to achieve the same purpose as the one described in Japanese Patent Laid-Open No. 2010-182765.

The shift direction of the microlens 101 is expressed as a vector along a light-incident face of the substrate 121 that is directed toward an intersection of the light-incident face of the substrate 121 and the center axis 1 of the microlens 101 from the center of the ranging pixel 110a. The photoelectric conversion unit 123 is so disposed that the direction of a vector obtained by projecting the vector representing the shift direction of the microlens 101 onto a straight line connecting the centers of the two photoelectric conversion units 122 and 123 is opposite to the direction of a vector that is directed toward the center of the photoelectric conversion unit 123 from the center of the ranging pixel 110a. The photoelectric conversion unit 122 is so disposed that the direction of the vector obtained by projecting the vector representing the shift direction of the microlens 101 onto the straight line connecting the centers of the two photoelectric conversion units 122 and 123 is identical to the direction of a vector that is directed toward the center of the photoelectric conversion unit 122 from the center of the ranging pixel 110a. Here, the centers of the photoelectric conversion units 122 and 123 correspond to the centroids of the regions occupied by the respective photoelectric conversion units 122 and 123 on the light-incident side (waveguide side) of the substrate 121. Hereinafter, the direction of the vector obtained by projecting the vector representing the shift direction of the microlens 101 onto the straight line connecting the centers of the two photoelectric conversion units 122 and 123 is referred to as a projection shift direction of the microlens 101. It is to be noted that axes 3 and 4 illustrated in FIG. 2A are, respectively, an axis that is parallel to the Z-axis and that passes through the center of the photoelectric conversion unit 123 and an axis that is parallel to the Z-axis and that passes through the center of the photoelectric conversion unit 122.

In the present exemplary embodiment, the area of the region occupied by the photoelectric conversion unit 123 is greater than the area of the region occupied by the photoelectric conversion unit 122 on the light-incident side (waveguide side) face of the substrate 121. More specifically, the width of the photoelectric conversion unit 123 is greater than the width of the photoelectric conversion unit 122 in the X-direction, and the width of the photoelectric conversion unit 122 is equal to the width of the photoelectric conversion unit 123 in the Y-direction. Hereinafter, the area of an end face located at the light-incident side of a photoelectric conversion unit is simply referred to as the area of the photoelectric conversion unit.

Although not illustrated, in the ranging pixel 110b, as in the ranging pixel 110a, the microlens is so disposed that its center axis is shifted relative to the center axis of the ranging pixel 110b. Specifically, the shift direction of the microlens in the ranging pixel 110b is opposite to the shift direction of the microlens 101 in the ranging pixel 110a. Therefore, while the photoelectric conversion unit 123 is disposed in the −X-direction and the photoelectric conversion unit 122 is disposed in the +X-direction in the ranging pixel 110a, the photoelectric conversion unit 122 is disposed in the −X-direction and the photoelectric conversion unit 123 is disposed in the +X-direction in the ranging pixel 110b, as viewed in the direction toward the paper plane. Configuring the ranging pixels 110a and 110b as described above makes it possible to measure the distance with high accuracy even in the peripheral regions 100a and 100b of the solid-state image sensor 100. Hereinafter, reasons therefor will be described while the above-described configuration is compared with a configuration in which the areas of a plurality of photoelectric conversion units included in a given ranging pixel are equal to each other.

Figure 11A:
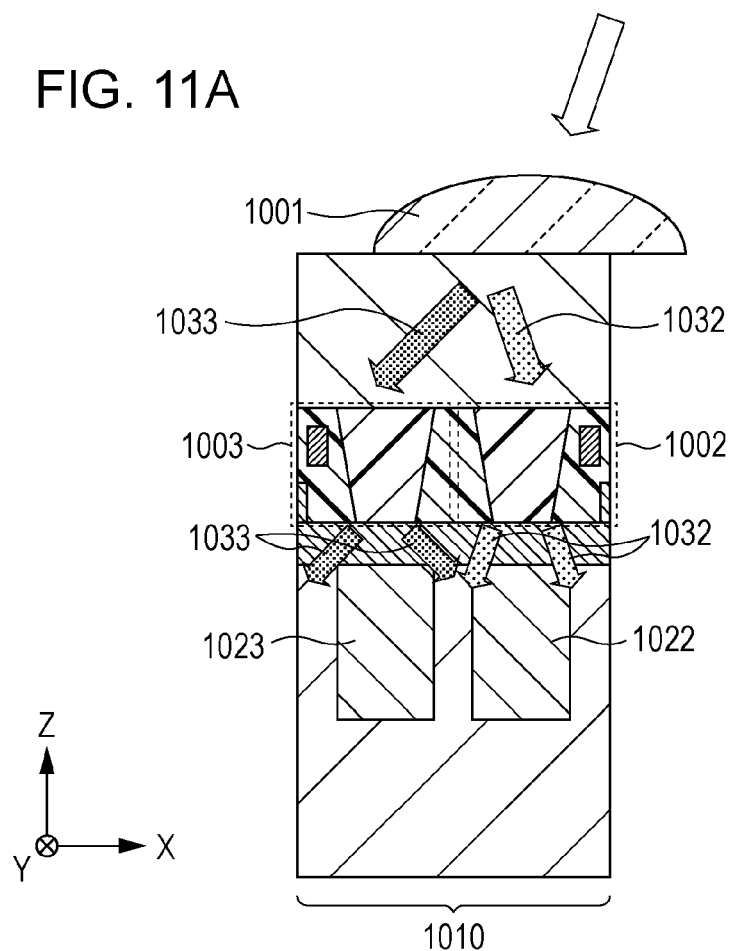
FIG. 11A is a schematic diagram illustrating a ranging pixel according to a comparative example.

FIG. 11A is a schematic diagram illustrating a ranging pixel 1010 according to a comparative example. The ranging pixel 1010 includes a microlens 1001, a plurality of waveguides 1002 and 1003, and a plurality of photoelectric conversion units 1022 and 1023 disposed from the light-incident side. Specifically, the center axis of the microlens 1001 is shifted in the +X-direction relative to the center axis of the ranging pixel 1010. The photoelectric conversion unit 1023 is disposed on a side of the center axis of the ranging pixel 1010 that is in a direction opposite to the projection shift direction of the microlens 1001. Meanwhile, the photoelectric conversion unit 1022 is disposed on another side of the center axis of the ranging pixel 1010 that is in a direction identical to the projection shift direction of the microlens 1001. Here, unlike the ranging pixel 110a illustrated in FIGS. 2A and 2B, the area of the photoelectric conversion unit 1022 is equal to the area of the photoelectric conversion unit 1023. The arrows illustrated in FIG. 11A indicate how the light beams propagate, which will be described later.

Figure 11B:
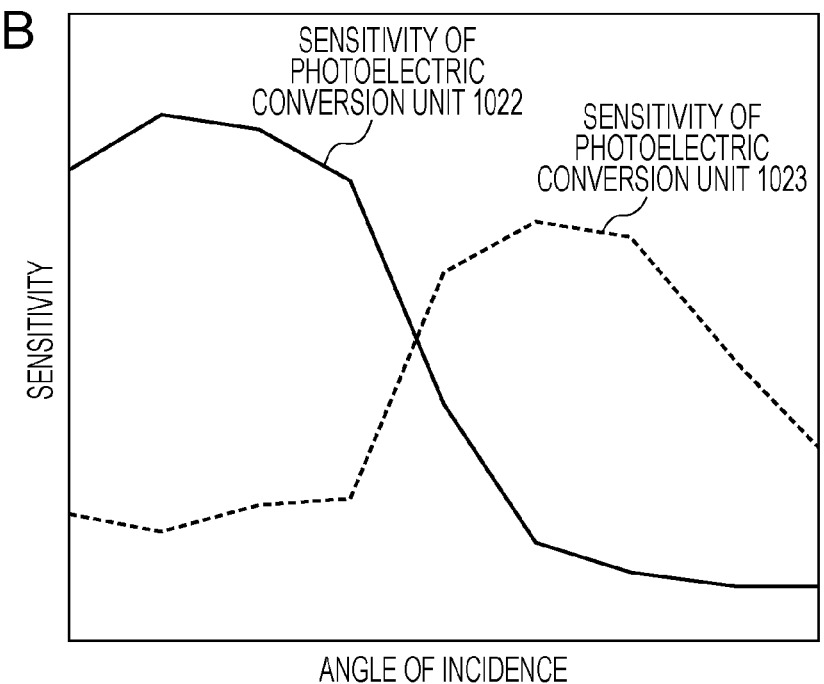
FIG. 11B is a schematic diagram illustrating the pixel sensitivity of the ranging pixel according to the comparative example.

FIG. 11B illustrates the sensitivity behavior of the ranging pixel 1010. As can be seen from FIG. 11B, the maximum value of the sensitivity of the photoelectric conversion unit 1023 is smaller than the maximum value of the sensitivity of the photoelectric conversion unit 1022. As a result, a difference is generated between the intensity of the electric signal obtained by the photoelectric conversion unit 1022 and the intensity of the electric signal obtained by the photoelectric conversion unit 1023. When there is a difference between the intensities of the electric signals, an error in reading the positional shift amount of the images increases, and thus the accuracy in measuring the distance decreases.

Subsequently, what causes a situation in which the sensitivity of the photoelectric conversion unit 1023 is lower than the sensitivity of the photoelectric conversion unit 1022 will be described. FIG. 11A illustrates the propagation of the light beams (indicated by the arrows) in a case in which the center of the microlens 1001 is shifted relative to the center of the ranging pixel 1010. As illustrated in FIG. 11A, a portion of the light beams incident on the microlens 1001 turns into a light beam 1033 that enters the waveguide 1003 located in a direction (−X-direction) opposite to the shift direction (+X-direction) of the microlens 1001. In addition, another portion of the light beams incident on the microlens 1001 turns into a light beam 1032 that enters the waveguide 1002 located in a direction (+X-direction) identical to the shift direction of the microlens 1001. The angle of incidence of the light beam 1033 entering the waveguide 1003 is greater than the angle of incidence of the light beam 1032 entering the waveguide 1002.

Typically, as the angle of incidence of a light beam entering a waveguide is greater, the light beam is more likely to couple with a higher guided mode of the waveguide than with a lower guided mode of the waveguide, and thus a light beam emitted from the waveguide is more likely to diverge. Therefore, the light beam 1033 emitted from the waveguide 1003 is more divergent than the light beam 1032 emitted from the waveguide 1002. Consequently, the quantity of light incident on the photoelectric conversion unit 1023 becomes less than the quantity of light incident on the photoelectric conversion unit 1022. Therefore, the efficiency of the light beam 1033 incident on the photoelectric conversion unit 1023 becomes lower than the efficiency of the light beam 1032 incident on the photoelectric conversion unit 1022. As a result, the sensitivity of the photoelectric conversion unit 1023 becomes lower than the sensitivity of the photoelectric conversion unit 1022.

In this manner, in the ranging pixel 1010 in a peripheral region of a solid-state image sensor, as the center of the microlens 1001 is shifted relative to the center of the ranging pixel 1010, a difference is generated between the efficiency of the light beam 1032 incident on the photoelectric conversion unit 1022 and the efficiency of the light beam 1033 incident on the photoelectric conversion unit 1023. As a result, a difference is generated between the sensitivities of the photoelectric conversion units 1022 and 1023, which leads to a deterioration of the accuracy in measuring the distance in the peripheral region.

On the other hand, the ranging pixel 110a disposed in the peripheral region 100a of the solid-state image sensor 100 has the above-described configuration as illustrated in FIGS. 2A and 2B. Specifically, the area of the photoelectric conversion unit 123 corresponding to the waveguide 103 from which a light beam is emitted at a larger angle is greater than the area of the photoelectric conversion unit 122 corresponding to the waveguide 102 from which a light beam is emitted at a smaller angle. Therefore, even if a divergent light beam is emitted from the waveguide 103, the divergent emitted light beam can be received by the photoelectric conversion unit 123 with high efficiency since the area of the photoelectric conversion unit 123 is relatively large.

Figure 3:
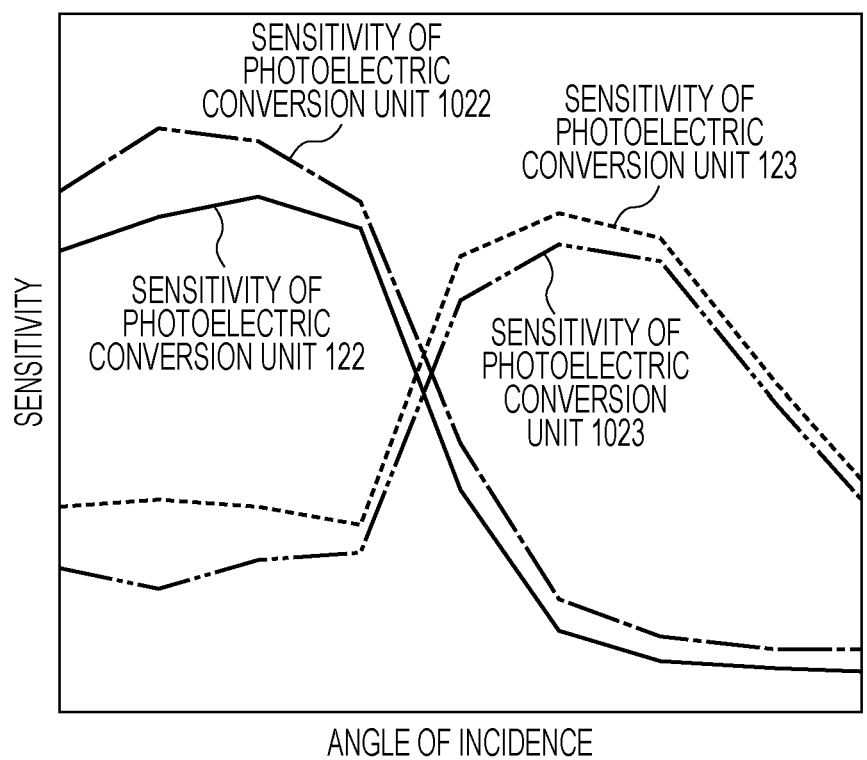
FIG. 3 is a schematic diagram indicating the pixel sensitivity of the ranging pixel according to the first exemplary embodiment.

FIG. 3 illustrates the sensitivity behavior of the ranging pixel 110a according to the present exemplary embodiment. It is to be noted that the sensitivity behavior of the ranging pixel 1010 illustrated in FIG. 11B is also illustrated in FIG. 3 for comparison. The solid line indicates the sensitivity behavior of the photoelectric conversion unit 122 in the ranging pixel 110a. The broken line indicates the sensitivity behavior of the photoelectric conversion unit 123 in the ranging pixel 110a. The dashed-dotted line indicates the sensitivity behavior of the photoelectric conversion unit 1022 in the ranging pixel 1010. The dashed-two-dotted line indicates the sensitivity behavior of the photoelectric conversion unit 1023 in the ranging pixel 1010.

As illustrated in FIG. 3, the difference between the maximum sensitivities of the photoelectric conversion units 122 and 123 in the ranging pixel 110a is smaller than the difference between the maximum sensitivities of the photoelectric conversion units 1022 and 1023 in the ranging pixel 1010. As a result, the difference between the intensity of the electric signal obtained by the photoelectric conversion unit 122 and the intensity of the electric signal obtained by the photoelectric conversion unit 123 is reduced, and the accuracy in reading the positional shift amount of the images improves. Thus, the accuracy in measuring the distance can be improved.

The waveguide 102 is formed by a core 104 and a clad 106, and guides a portion of the light from the microlens 101 to the photoelectric conversion unit 122 through primarily the core 104 that propagates the light. Meanwhile, the waveguide 103 is formed by a core 105 and a clad 107, and guides another portion of the light from the microlens 101 to the photoelectric conversion unit 123 through primarily the core 105 that propagates the light.

The cores 104 and 105 and the clads 106 and 107 forming the waveguides 102 and 103 can be made of an inorganic substance, such as silicon oxide, silicon nitride, silicon oxynitride, silicon carbide, and BPSG, or an organic substance, such as a polymer and a resin. It is to be noted that the combination of the substances is so selected that the refractive index of the core 104 is greater than the refractive index of the clad 106 and the refractive index of the core 105 is greater than the refractive index of the clad 107. Here, the refractive indices are compared in terms of the refractive indices at a wavelength (e.g., 530 nm for a green pixel of a solid-state image sensor for a digital camera) of a light beam incident on a ranging pixel. In addition, the wires 108 are provided in the clads 106 and 107 for transferring electric charges generated by the photoelectric conversion units 122 and 123 to a signal processing circuit.

The photoelectric conversion units 122 and 123 are formed by providing potential distribution through ion implantation or the like on the substrate 121 that is formed by a material, such as silicon, having absorbing properties in a detection wavelength band. The photoelectric conversion units 122 and 123 each have a function of converting light to an electric charge. In addition, a gettering layer 109 is formed between the waveguides 102 and 103 and the photoelectric conversion units 122 and 123 for preventing the incident light from being reflected and for preventing the photoelectric conversion units 122 and 123 from being contaminated. As the gettering layer 109, a layer formed by any one of BPSG, $SiO_2$, and SiN, or a layer obtained by stacking BPSG, $SiO_2$, and SiN may be used.

The microlens 101 is made of a material, such as silicon oxide and an organic substance, that is transparent in the detection wavelength band, and is disposed across the photoelectric conversion units 122 and 123. A material being transparent herein means that the transmittance of the material to the light in the detection wavelength band is 80% or higher, or preferably 99% or higher. The ranging pixels 110a are in 1-to-1 correspondence with the microlenses 101. Specifically, the microlens 101 is so disposed that its focal position lies inside the waveguide 102 or 103 of the ranging pixel 110a. As long as such a condition is satisfied, the microlens 101 may partially overlap an adjacent pixel. An underlying layer 130 may be formed between the microlens 101 and the waveguides 102 and 103. The underlying layer 130 may include a color filter.

Modifications

Figure 4A:
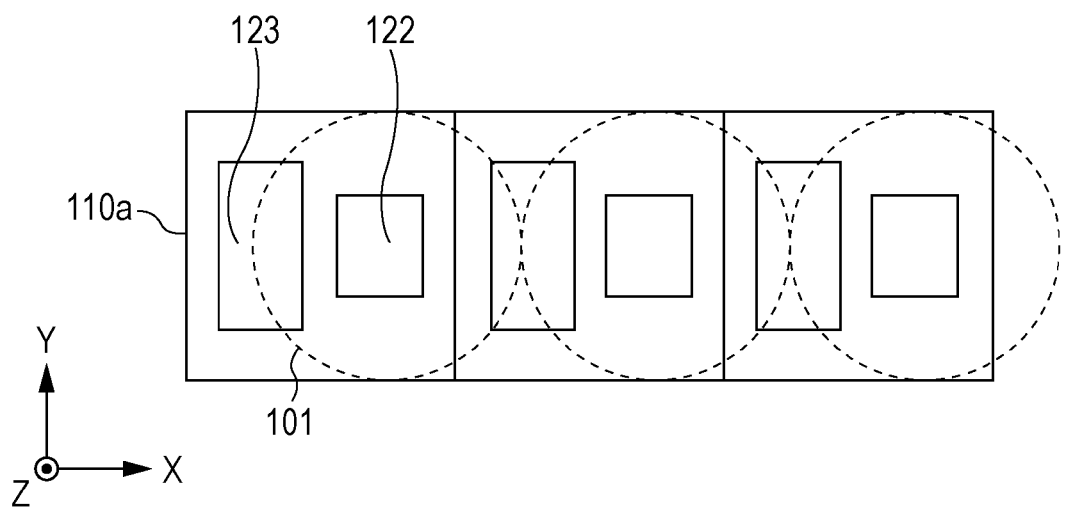
FIGS. 4A and 4B are schematic diagrams illustrating another example of ranging pixels according to the first exemplary embodiment.
Figure 4B:
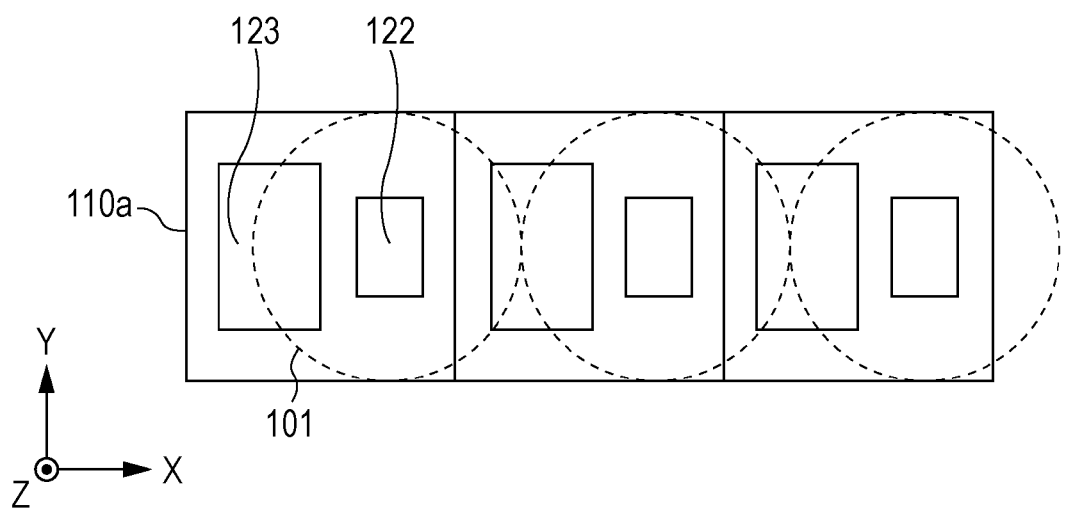

Although the widths of the photoelectric conversion units 122 and 123 in the X-direction are set to be different from each other in order to set the area of the photoelectric conversion unit 122 to be different from the area of the photoelectric conversion unit 123 in the configuration illustrated in FIGS. 2A and 2B, the exemplary embodiment is not limited to such a configuration. Alternatively, only the widths of the photoelectric conversion units 122 and 123 in the Y-direction may be different from each other as illustrated in FIG. 4A, or the widths of the photoelectric conversion units 122 and 123 in both the X-direction and the Y-direction may be different from each other as illustrated in FIG. 4B. However, in the light of symmetry in the wiring layout, it is preferable that the widths of the photoelectric conversion units 122 and 123 be different only in a direction (X-direction in the case of the configuration illustrated in FIGS. 2A and 2B) in which the waveguides 102 and 103 are arrayed in the ranging pixel 110a. The section of each of the photoelectric conversion units 122 and 123 along the XY-plane may be polygonal, such as a rectangle as illustrated in FIGS. 2A, 4A, and 4B, or may be circular or elliptical.

The angle of incidence of a principal ray incident on a pixel is greater in a pixel that is further spaced apart from the center (centroid position) of the solid-state image sensor 100. In particular, the angle of incidence is larger in a region that is spaced apart from the center of the solid-state image sensor 100 by a distance that is no less than 0.25 times the length of the diagonal line of the solid-state image sensor 100, and the angle of incidence is even larger in a region that is spaced apart from the center of the solid-state image sensor 100 by a distance that is no less than 0.4 times the length of the diagonal line. Accordingly, the difference between the angles of incidence of the light beams entering the different waveguides within a given ranging pixel becomes larger in the aforementioned region, and the difference between the divergences of the light beams emitted from the waveguides also becomes larger. Therefore, the difference between the efficiencies of the light beams incident on the photoelectric conversion units becomes larger, which aggravates the aforementioned problem. Therefore, in the present exemplary embodiment, regions that are spaced apart from the center of the solid-state image sensor 100 by a distance that is no less than 0.4 times the length of the diagonal line of the solid-state image sensor 100 are designated as the peripheral regions 100a and 100b, and the ranging pixels located in the peripheral regions 100a and 100b are configured as the ranging pixels having the above-described configuration. Furthermore, it is preferable that ranging pixels located in a region that is spaced apart from the center of the solid-state image sensor 100 by a distance that is no less than 0.25 times the length of the diagonal line of the solid-state image sensor 100 be also configured as the ranging pixels having the above-described configuration.

As described above, the angle of incidence of a principal ray incident on a pixel is greater in a pixel that is further spaced apart from the center of the solid-state image sensor, and thus it is preferable that the shift amount of the microlens in the shift direction be greater in a ranging pixel that is further spaced apart from the center of the solid-state image sensor. In other words, of two ranging pixels, it is preferable that the shift amount of the microlens in one of the ranging pixels that is farther from the center of the solid-state image sensor be greater than the shift amount of the microlens in the other ranging pixel that is closer to the center of the solid-state image sensor. Such a configuration brings about an effect that a variation in the sensitivity among pixels within the solid-state image sensor is suppressed. It is to be noted that, of the two ranging pixels, the distance between the centroid of the ranging pixel and the center of the solid-state image sensor is greater for the ranging pixel that is farther from the center of the solid-state image sensor than for the ranging pixel that is closer to the center of the solid-state image sensor.

In each of the ranging pixels 110a, the waveguides 102 and 103 are arrayed in the projection shift direction of the microlens 101, and thus as the shift amount of the microlens 101 in the projection shift direction is greater, the difference between the divergences of the light beams emitted from the plurality of waveguides 102 and 103 becomes larger. In other words, the difference between the efficiencies of the light beams incident on the photoelectric conversion units 122 and 123 within the ranging pixel 110a becomes larger. Therefore, as the shift amount of the microlens 101 in the projection shift direction thereof is greater, it is preferable that the difference between the area of the photoelectric conversion unit 122 and the area of the photoelectric conversion unit 123 be greater.

Figure 5A:
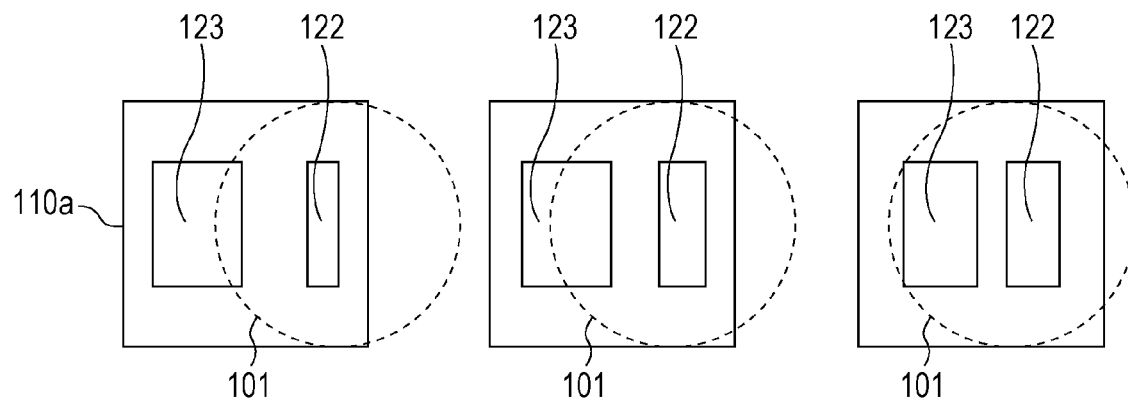
FIGS. 5A and 5B are schematic diagrams illustrating yet another example of ranging pixels according to the first exemplary embodiment.

An example of such a configuration is illustrated in FIG. 5A. FIG. 5A illustrates a layout of elements provided in the three ranging pixels 110a located in a region enclosed by the dashed-dotted line in FIG. 1. It is to be noted that FIG. 5A illustrates the ranging pixels 110a in a state in which they are spaced apart from one another. In addition, the order in which the three ranging pixels 110a are disposed in FIG. 5A is the same as the order in which the three ranging pixels 110a are disposed in the region enclosed by the dashed-dotted line in FIG. 1. The ranging pixel 110a disposed at the leftmost side is the ranging pixel 110a that is farthest from the center of the solid-state image sensor 100 among the three ranging pixels 110a, and the ranging pixel 110a disposed at the rightmost side is the ranging pixel 110a that is closest to the center of the solid-state image sensor 100 among the three ranging pixels 110a. Accordingly, the shift amount of the microlens 101 is greater as the ranging pixel 110a is located closer to the left side, and the difference between the area of the photoelectric conversion unit 122 and the area of the photoelectric conversion unit 123 is greater.

In this manner, as the areas of the photoelectric conversion units 122 and 123 are set to differ in accordance with the shift amount of the microlens 101, the difference between the sensitivities of the photoelectric conversion units 122 and 123 is reduced regardless of the shift amount of the microlens 101. Thus, the accuracy in measuring the distance can be further improved.

Although an example in which both the area of the photoelectric conversion unit 122 and the area of the photoelectric conversion unit 123 are varied in accordance with the shift amount of the microlens 101 is illustrated in FIG. 5A, only one of the areas of the photoelectric conversion units 122 and 123 may be varied. However, it is preferable that the difference between the areas of the photoelectric conversion units 122 and 123 in each of the ranging pixels 110a be so varied that the sum of the areas of the photoelectric conversion units 122 and 123 is constant among different ranging pixels 110a in order to improve the utilization efficiency of light incident on the ranging pixels 110a.

Figure 5B:
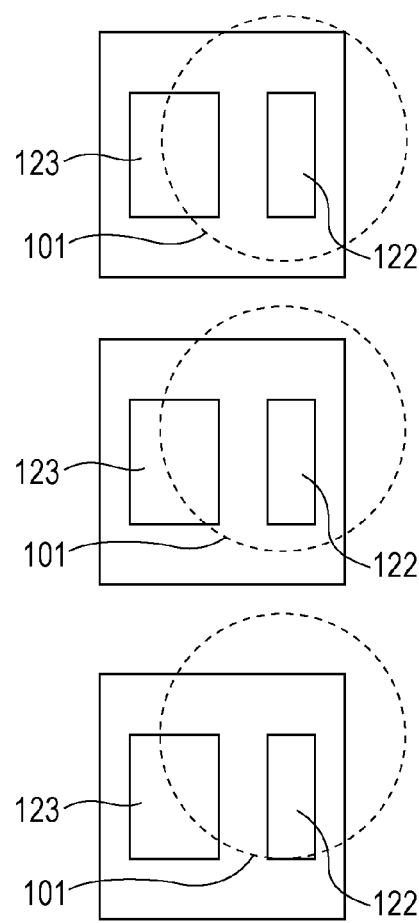

In addition, the shift direction of the microlens 101 does not have to be the X-direction, and the microlens 101 may be shifted at an angle relative to the X-direction. Light beams incident on the pixels located in the peripheral regions 100a and 100b of the solid-state image sensor 100 are inclined toward the center of the solid-state image sensor 100, and thus it is preferable that the microlens 101 be shifted toward the center of the solid-state image sensor 100 at an angle relative to the X-direction, so that the light beams can be received with high efficiency. An example of such a configuration is illustrated in FIG. 5B. FIG. 5B illustrates the three ranging pixels 110a located in a region enclosed by the dashed-two-dotted line in FIG. 1. It is to be noted that FIG. 5B illustrates the ranging pixels 110a in a state in which they are spaced apart from one another. In this manner, the shift direction of the microlens 101 disposed in the ranging pixel 110a may be varied in accordance with the disposed position of the ranging pixel 110a.

Even in a case in which the shift direction of the microlens 101 is at an angle relative to the X-direction, the angle of incidence of the light beam entering the waveguide 103 is greater than the angle of incidence of the light beam entering the waveguide 102. Therefore, as the area of the photoelectric conversion unit 123 is set to be greater than the area of the photoelectric conversion unit 122, the difference between the sensitivities of the plurality of photoelectric conversion units 122 and 123 can be suppressed, and the accuracy in measuring the distance can be improved.

The angle of incidence of a principal ray incident on a pixel is small in a central region of the solid-state image sensor 100. Specifically, the angle of incidence of a principal ray is small in a central region that is closer to the center of the solid-state image sensor 100 than a position located at a distance of less than 0.25 times the length of the diagonal line of the solid-state image sensor 100 from the center of the solid-state image sensor 100, and thus a problem rarely arises. Therefore, in a case in which a ranging pixel is disposed in the aforementioned central region, the center axis of the microlens does not need to be shifted relative to the center axis of the ranging pixel.

In addition, in a ranging pixel located in a peripheral region of the solid-state image sensor 100 in the Y-direction, a principal ray incident on the ranging pixel is inclined in the Y-direction, and thus it is preferable that the microlens be shifted in the Y-direction.

In this manner, in a case in which the center axis of the microlens 101 is not shifted relative to the center axis of the ranging pixel 110a in the X-direction, which is the direction in which the waveguides 102 and 103 are arrayed, the angles of incidence of the principal rays that couple with the respective waveguides 102 and 103 become equal to each other. Therefore, it is preferable that the areas of the photoelectric conversion units 122 and 123 be equal to each other. In other words, in a case in which the microlens 101 is not shifted or the shift direction of the microlens 101 is orthogonal to the direction in which the plurality of photoelectric conversion units 122 and 123 are arrayed, it is preferable that the areas of the plurality of photoelectric conversion units 122 and 123 be equal to each other.

The entire pixels forming the solid-state image sensor 100 may be the ranging pixels 110. Alternatively, some of the pixels may be the ranging pixels 110, and the rest of the pixels may be normal image-capturing pixels. In a case in which the entire pixels are the ranging pixels 110, a captured image can be obtained by obtaining the sum of the electric signals obtained by the plurality of photoelectric conversion units. It is to be noted that a single photoelectric conversion unit, a single waveguide including a core and a clad disposed on the single photoelectric conversion unit, and a microlens disposed on the single waveguide are provided in each image-capturing pixel.

In a case in which some of the pixels in the solid-state image sensor 100 are the ranging pixels 110a, images captured by the ranging pixels 110a may be obtained through the method described above, or may be obtained by complementing the aforementioned images by captured images obtained by the normal image-capturing pixels provided around the ranging pixels 110a. It is preferable that the microlenses be shifted toward the center of the solid-state image sensor 100 even in the image-capturing pixels located in the peripheral regions 100a and 100b, in order to improve the quality of the captured images.

Second Exemplary Embodiment

In the first exemplary embodiment, a mode in which the areas of the photoelectric conversion units 122 and 123 are set to differ from each other has been described. In the meantime, in the present exemplary embodiment, a mode in which control electrodes are provided in the vicinity of photoelectric conversion units and the effective areas of the photoelectric conversion units are controlled by applying biases to the control electrodes will be described.

Figure 6A:
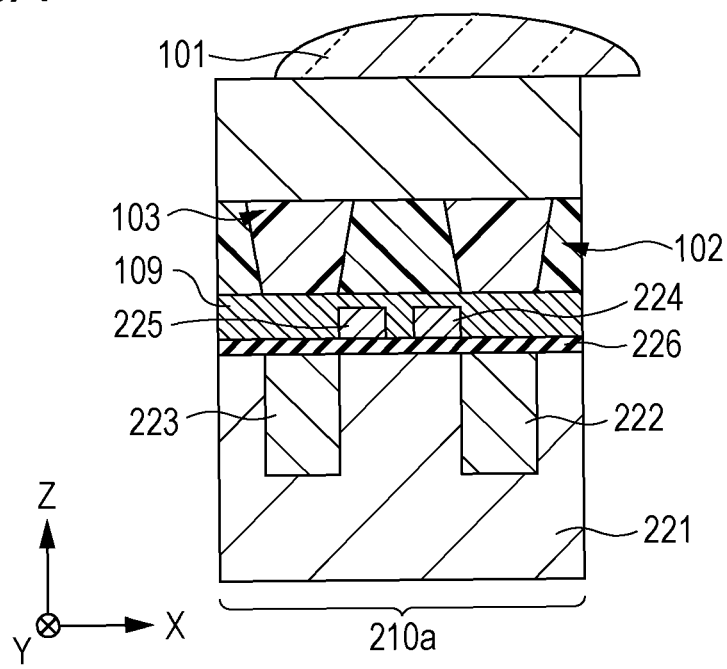
FIGS. 6A through 6C are schematic diagrams illustrating an example of a ranging pixel according to a second exemplary embodiment.
Figure 6B:
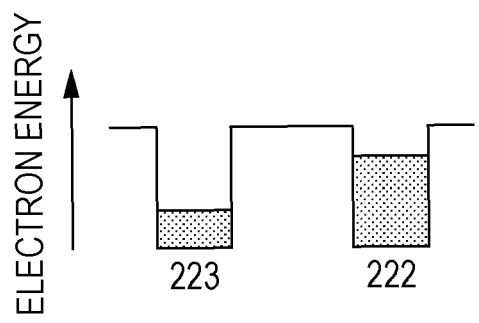
Figure 6C:
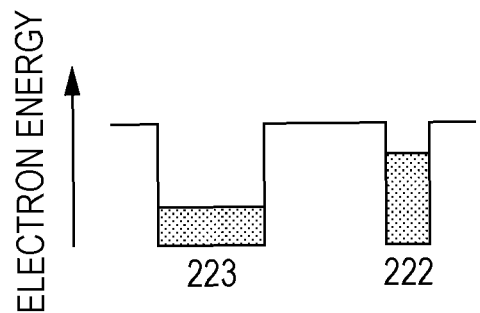

FIGS. 6A through 6C are schematic sectional views of a ranging pixel 210a according to the present exemplary embodiment, and the ranging pixel 210a is to be disposed in the peripheral region 100a illustrated in FIG. 1. In the ranging pixel 210a, a microlens 101, a plurality of waveguides 102 and 103, and a plurality of photoelectric conversion units 222 and 223 formed inside a substrate 221 are provided from the side on which light is incident on the ranging pixels 210a. In addition, a gettering layer 109 and an insulating layer 226 are disposed between the waveguides 102 and 103 and the substrate 221. Furthermore, a plurality of control electrodes 224 and 225 are provided in the gettering layer 109. In other words, along the direction in which the light is incident, the plurality of control electrodes 224 and 225 are disposed on the same side as the waveguides 102 and 103 relative to the photoelectric conversion units 222 and 223. The photoelectric conversion unit 222 is disposed on a side of the center axis of the ranging pixel 210a that is in a direction identical to the projection shift direction of the microlens 101. Meanwhile, the photoelectric conversion unit 223 is disposed on another side of the center axis of the ranging pixel 210a that is in a direction opposite to the projection shift direction of the microlens 101.

The control electrode 224 is disposed on a side of the center axis of the ranging pixel 210a where the photoelectric conversion unit 222 is disposed. More specifically, the control electrode 224 is disposed at a position where the control electrode 224 affects the potential distribution around the photoelectric conversion unit 222. In addition, the control electrode 224 is applied with a bias so as to cause repulsive force between the control electrode 224 and carriers accumulated in the photoelectric conversion units 222 and 223. Meanwhile, the control electrode 225 is disposed on another side of the center axis of the ranging pixel 210a where the photoelectric conversion unit 223 is disposed. More specifically, the control electrode 225 is disposed at a position where the control electrode 225 affects the potential distribution around the photoelectric conversion unit 223. In addition, the control electrode 225 is applied with a bias so as to cause attractive force between the control electrode 225 and carriers accumulated in the photoelectric conversion units 222 and 223. The control electrodes 224 and 225 can be made of metal, such as Al and Cu, an oxide conductor, such as ITO, or a semiconductor, such as polysilicon.

Then, as the biases described above are applied to the respective control electrodes 224 and 225, the effective area of the photoelectric conversion unit 223 can be made greater than the effective area of the photoelectric conversion unit 222. In this manner, as the effective areas of the photoelectric conversion units 222 and 223 are varied, the difference between the sensitivities of the photoelectric conversion units 222 and 223 generated due to the microlens 101 being shifted can be reduced as in the first exemplary embodiment, and the accuracy in measuring the distance can thus be improved.

Subsequently, a principle that explains why the effective areas of the photoelectric conversion units 222 and 223 are varied by the control electrodes 224 and 225 will be described. Although, for simplicity, a case in which an N-type carrier (electron) serves as a signal will be described as an example hereinafter, it is obvious that the description below can also be applied to a case in which a P-type carrier (hole) serves as a signal. In that case, the signs of the biases to be applied to the respective control electrodes 224 and 225 may be reversed.

When the biases to be applied to the control electrodes 224 and 225 are both 0, the potential distribution of electrons in the substrate 221 is determined on the basis of the distribution of impurities through ion implantation when the photoelectric conversion units 222 and 223 are fabricated. For example, in a case in which the ion implantation distribution is symmetric about the center axis of the ranging pixel 210a, when the biases are not applied to the control electrodes 224 and 225, the areas of the photoelectric conversion units 222 and 223 are equal to each other (see FIG. 6A). The potential distribution of electrons in the substrate 221 and the amount of electrons accumulated in depletion layers in the case illustrated in FIG. 6A are illustrated in FIG. 6B. As illustrated in FIG. 6B, the widths of the depletion layers corresponding to the respective photoelectric conversion units 222 and 223 in the X-direction are equal to each other, as in the areas of the photoelectric conversion units 222 and 223. As has been described in the first exemplary embodiment, due to the divergence of the light beam emitted from the waveguide 103, a portion of the emitted light beam is not received by the photoelectric conversion unit 223. Therefore, the amount of electrons accumulated in the depletion layer corresponding to the photoelectric conversion unit 223 is less than the amount of electrons accumulated in the depletion layer corresponding to the photoelectric conversion unit 222. This appears as the difference between the sensitivities of the photoelectric conversion units 222 and 223.

Therefore, in the present exemplary embodiment, a negative bias is applied to the control electrode 224, and a positive bias is applied to the control electrode 225. Thus, repulsive force acts between the control electrode 224 and an electron generated by light emitted from the waveguide 103 and incident on a region between the photoelectric conversion units 222 and 223, and attractive force acts between the control electrode 225 and the aforementioned electron. As a result, the electron moves toward the photoelectric conversion unit 223 and is accumulated in the depletion layer formed at the side of the photoelectric conversion unit 223 by the control electrode 225. In other words, it seems as if the potential energy of the electron has increased in a region of the substrate 221 that corresponds to the control electrode 224 and the potential energy of the electron has decreased in a region of the substrate 221 that corresponds to the control electrode 225. In other words, it is considered that, in a case in which the above-described biases are applied to the respective control electrodes 224 and 225, the potential distribution of the electrons as illustrated in FIG. 6C is formed on the substrate of the substrate 221. In other words, it appears as if the width of the depletion layer corresponding to the photoelectric conversion unit 223 in the X-direction has become greater than the width of the depletion layer corresponding to the photoelectric conversion unit 222 in the X-direction, and it is considered that the apparent area of the photoelectric conversion unit 223 has become greater than the area of the photoelectric conversion unit 222. Then, as illustrated in FIG. 6C, the difference between the amounts of electrons confined in the depletion layers corresponding to the respective photoelectric conversion units 222 and 223 can be reduced. Accordingly, the difference between the sensitivities of the photoelectric conversion units 222 and 223 can be reduced.

Figure 7A:
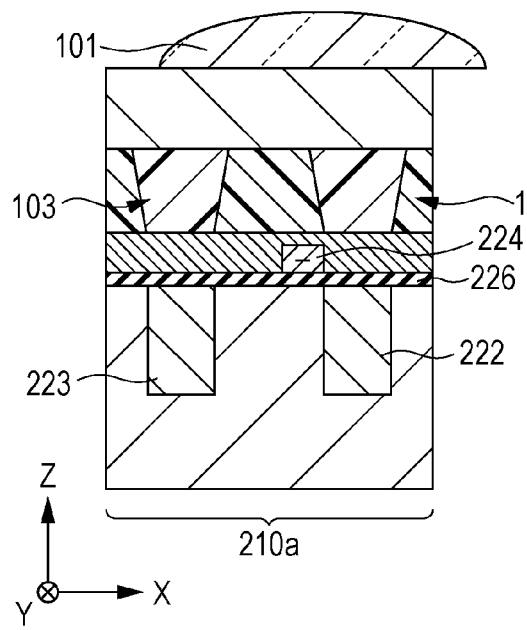
FIGS. 7A through 7C are schematic diagrams illustrating another example of a ranging pixel according to the second exemplary embodiment.
Figure 7B:
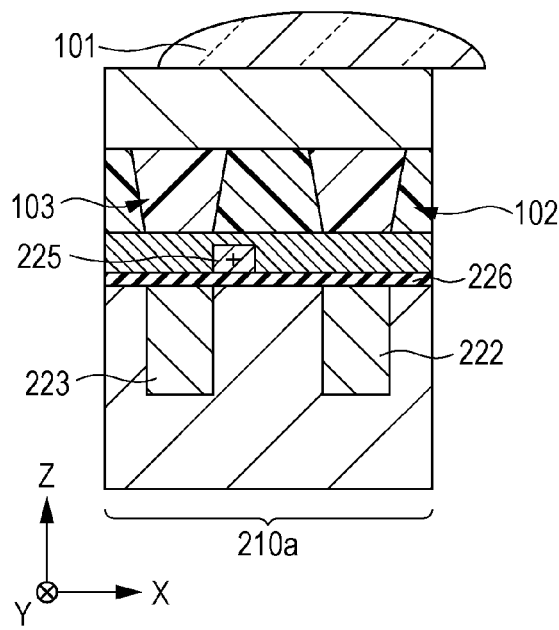

Although a configuration in which the two control electrodes 224 and 225 are provided is illustrated in FIG. 6A, only one of the control electrodes 224 and 225 may be provided. For example, as illustrated in FIG. 7A, only the control electrode 224 may be provided, and a negative bias may be applied to the control electrode 224. Alternatively, as illustrated in FIG. 7B, only the control electrode 225 may be provided, and a positive bias may be applied to the control electrode 225.

In addition, although the control electrodes 224 and 225 are disposed toward the center axis of the ranging pixel 210a relative to the corresponding photoelectric conversion units 222 and 223, the control electrodes 224 and 225 may be disposed toward the sides away from the center axis relative to the corresponding photoelectric conversion units 222 and 223. However, the light beam incident on the ranging pixel 210a is primarily incident on the photoelectric conversion units 222 and 223 and on a region between the photoelectric conversion units 222 and 223, and thus it is preferable that the control electrodes 224 and 225 be disposed toward the center axis of the ranging pixel 210a relative to the corresponding photoelectric conversion units 222 and 223. Alternatively, the control electrodes 224 and 225 may be disposed so as to surround the corresponding photoelectric conversion units 222 and 223.

In a case in which three or more control electrodes are to be provided, in a similar manner as described above, a positive bias may be applied to a control electrode or control electrodes disposed toward the photoelectric conversion unit 223 relative to the center axis of the ranging pixel 210a, and a negative bias may be applied to a control electrode or control electrodes disposed toward the photoelectric conversion unit 222 relative to the center axis of the ranging pixel 210a.

Figure 7C:
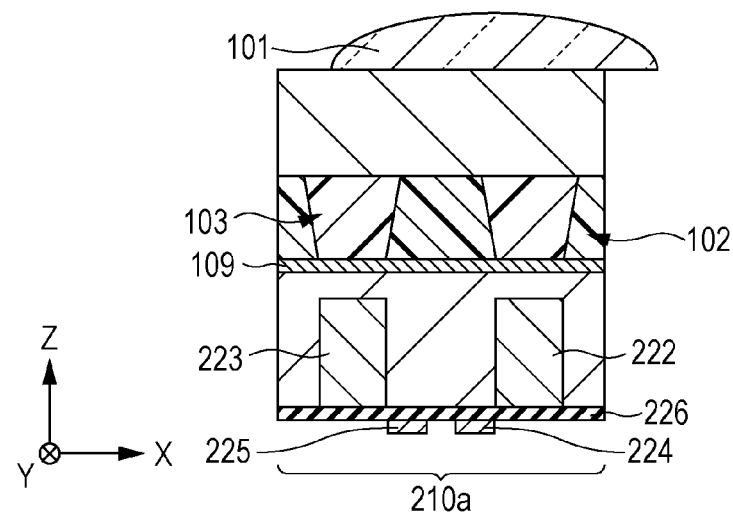

In addition, as illustrated in FIG. 7C, the control electrodes 224 and 225 may be disposed on a side opposite to the side on which the light is incident. In other words, the control electrodes 224 and 225 may be disposed on the side opposite to the side of the photoelectric conversion units 222 and 223 where the waveguides 102 and 103 are disposed. This configuration may be preferable because scattering and absorption of light by the control electrodes 224 and 225 can be prevented.

According to the present exemplary embodiment, the effective areas of the photoelectric conversion units 222 and 223 can be controlled dynamically by controlling the magnitude of the biases applied to the respective control electrodes 224 and 225. In addition, as the absolute values of the biases applied to the respective control electrodes 224 and 225 are greater, the difference between the effective areas of the photoelectric conversion units 222 and 223 can be increased.

Typically, the angle of a principal ray incident on a ranging pixel is small when a telephoto-side imaging lens is used, and the angle of a principal ray incident on a ranging pixel is large when a wide-angle-side imaging lens is used. As the angle of a principal ray incident on a ranging pixel is larger, the angle of incidence of a light beam entering a waveguide disposed on a side of the center axis of the ranging pixel that is in a direction opposite to the projection shift direction of the microlens increases. Therefore, it is preferable that, in a configuration in which an imaging lens is replaceable, the biases to be applied to the control electrodes 224 and 225 be controlled so as to differ in between a case in which a wide-angle-side imaging lens is used and a case in which a telephoto-side imaging lens is used. Specifically, in a case in which a telephoto-side imaging lens is used, the absolute values of the biases to be applied to the control electrodes 224 and 225 may be set smaller so as to reduce the difference between the effective areas of the photoelectric conversion units 222 and 223. Meanwhile, in a case in which a wide-angle-side imaging lens is used, the absolute values of the biases to be applied to the control electrodes 224 and 225 may be set larger so as to increase the difference between the effective areas of the photoelectric conversion units 222 and 223.

Third Exemplary Embodiment

In the ranging pixels in the solid-state image sensors according to the first and second exemplary embodiments, the plurality of waveguides are arrayed in the X-direction. In other words, a solid-state image sensor measures a distance by dividing a light beam incident on a ranging pixel in the X-direction and obtaining the divided light beam. However, the present invention may be applied to a solid-state image sensor that includes a ranging pixel that divides an incident light beam in a direction other than the X-direction.

Figure 8:
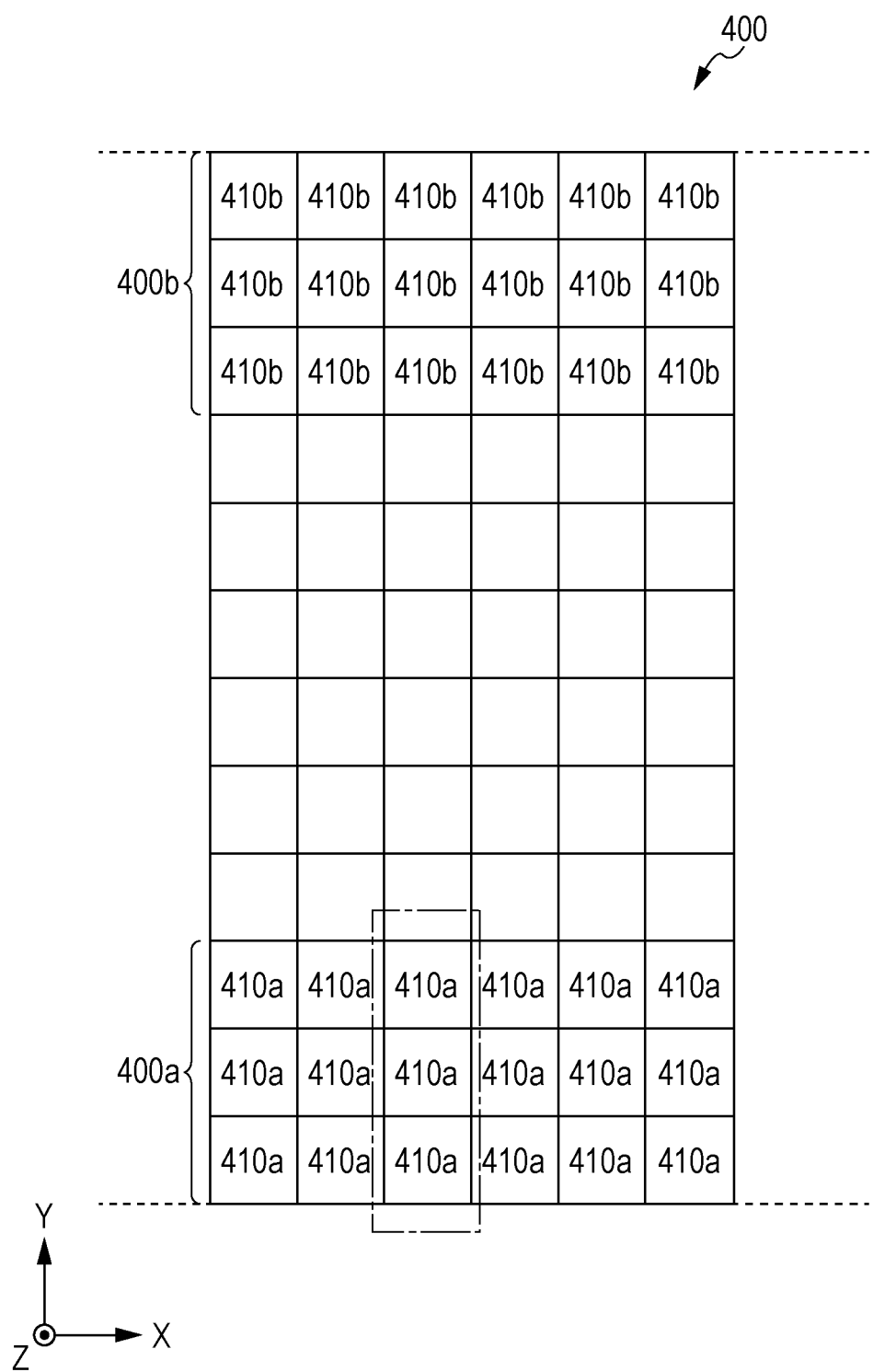
FIG. 8 is a schematic diagram illustrating an example of a solid-state image sensor according to a third exemplary embodiment.

FIG. 8 illustrates a portion of a solid-state image sensor 400 according to the present exemplary embodiment. It is to be noted that, in the present exemplary embodiment, as in the first exemplary embodiment, the X-direction corresponds to the lengthwise direction of the solid-state image sensor 400, and the Y-direction corresponds to the widthwise direction of the solid-state image sensor 400. In the solid-state image sensor 400, ranging pixels 410 that measure the distance by dividing an incident light beam in the Y-direction are disposed. Ranging pixels 410a are disposed in a peripheral region 400a of the solid-state image sensor 400 that is located to the bottom side on the paper plane. Meanwhile, ranging pixels 410b are disposed in a peripheral region 400b of the solid-state image sensor 400 that is located to the top side on the paper plane.

Figure 9A:
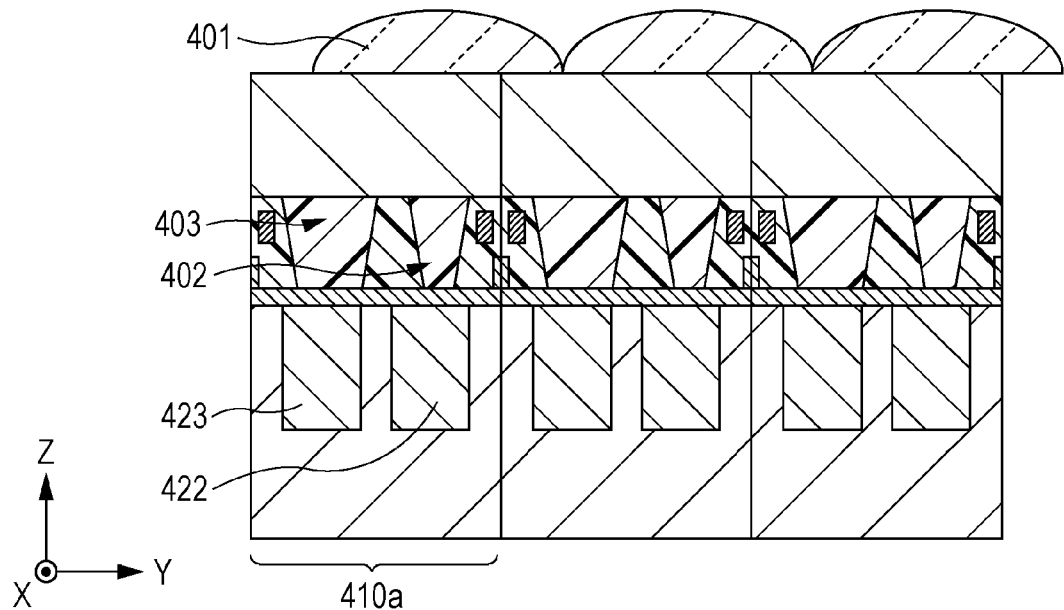
FIGS. 9A and 9B are schematic diagrams illustrating an example of ranging pixels according to the third exemplary embodiment.
Figure 9B:
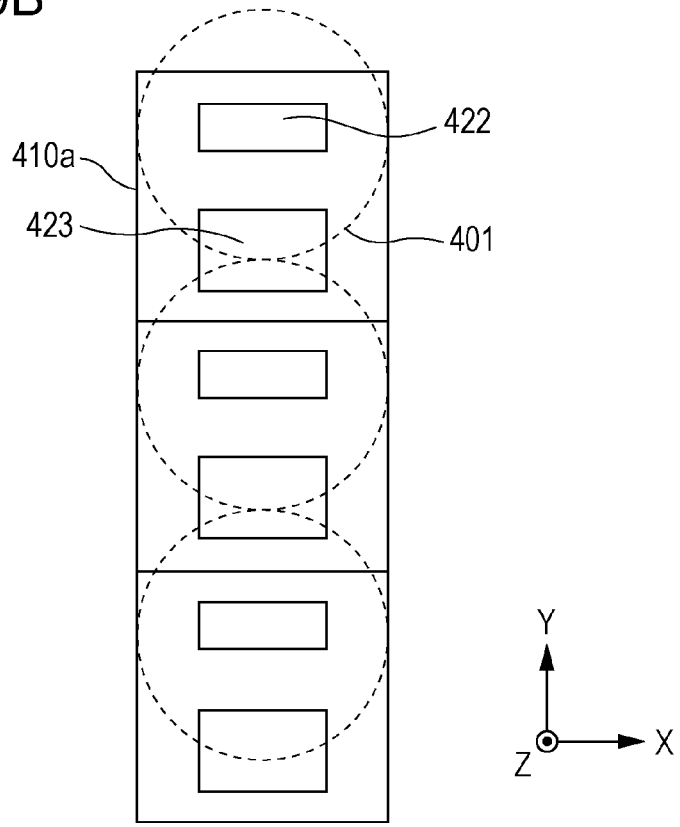

FIGS. 9A and 9B illustrate the configuration of the three ranging pixels 410a enclosed by the dashed-dotted line in FIG. 8. FIG. 9A is a schematic sectional view of the three ranging pixels 410a taken along the YZ-plane. The ranging pixels 410a each include a microlens 401, a plurality of waveguides 402 and 403, and a plurality of photoelectric conversion units 422 and 423 disposed from the light-incident side. FIG. 9B is a schematic plan view of the three ranging pixels 410a along the XY-plane.

The microlens 401 is shifted in the direction (+Y-direction) toward the center of the solid-state image sensor 400 relative to the center axis of the ranging pixel 410a. In addition, the plurality of waveguides 402 and 403 and the plurality of photoelectric conversion units 422 and 423 are arrayed in the Y-direction. In the ranging pixel 410a, the photoelectric conversion unit 423 is disposed on a side of the center axis of the ranging pixel 410 that is in a direction opposite to the projection shift direction of the microlens 401. Meanwhile, the photoelectric conversion unit 422 is disposed on another side of the center axis of the ranging pixel 410a in a direction identical to the projection shift direction of the microlens 401.

In addition, the width, in the Y-direction, of the photoelectric conversion unit 423 disposed on the side that is in the direction (−Y-direction) opposite to the shift direction of the microlens 401 is greater than the width, in the Y-direction, of the photoelectric conversion unit 422 disposed on the side that is in the direction (+Y-direction) identical to the shift direction of the microlens 401. In other words, the area of the photoelectric conversion unit 423 is greater than the area of the photoelectric conversion unit 422. With this configuration, as in the first exemplary embodiment, the difference between the maximum sensitivities of the photoelectric conversion units 422 and 423 can be reduced, and thus the accuracy in measuring the distance is improved.

It is to be noted that the solid-state image sensor may include the ranging pixels 110 that each divide the incident light beam in the X-direction and the ranging pixels 410 that each divide the incident light beam in the Y-direction. With such a configuration, the distance can be measured irrespective of the direction of contrast of a target of imaging. Even in this case, the areas of the photoelectric conversion units may be determined in accordance with the shift direction of the microlens and the direction in which the plurality of waveguides and photoelectric conversion units are arrayed.

Fourth Exemplary Embodiment

FIG. 10 is a schematic diagram of an image-capturing device 190, such as a digital still camera and a digital video camera, that includes the solid-state image sensor 100 according to the first exemplary embodiment. The image-capturing device 190 includes, aside from the solid-state image sensor 100, an imaging optical system 191, a central processing unit (CPU) 192, a transfer circuit 193, and a signal processing unit 194, and the imaging optical system 191 is disposed toward the light-incident side relative to the solid-state image sensor 100. The CPU 192 controls the operations of the transfer circuit 193 and the signal processing unit 194. Signals obtained by the photoelectric conversion units 122 and 123 are transferred to the signal processing unit 194 through the transfer circuit 193, and ranging images are formed by the signal processing unit 194. The ranging images are then compared by the signal processing unit 194, and thus the distance is measured. In a similar manner, the signals obtained by the photoelectric conversion units 122 and 123 are processed by the signal processing unit 194 and are also used as signals for a captured image.

Other Exemplary Embodiments

Although an example in which two waveguides and two photoelectric conversion units are provided in each ranging pixel has been illustrated in each of the first through fourth exemplary embodiments, three or more waveguides and three or more photoelectric conversion units may be provided. Even in a case in which three or more waveguides and three or more photoelectric conversion units are provided in a ranging pixel, it is sufficient if at least two among the three or more waveguides satisfy the configuration described below. Specifically, it is sufficient if the area of one of the two photoelectric conversion units that is disposed on a side of the center axis of the ranging pixel that is in a direction opposite to the projection shift direction of a microlens is greater than the area of the other photoelectric conversion unit disposed on another side of the center axis of the ranging pixel that is in a direction identical to the projection shift direction of the microlens. Alternatively, control electrodes for achieving a configuration in which the effective area of one of the two photoelectric conversion units that is disposed on a side of the center axis of the ranging pixel that is in a direction opposite to the projection shift direction of a microlens is greater than the effective area of the other photoelectric conversion unit disposed on another side of the center axis of the ranging pixel that is in a direction identical to the projection shift direction of the microlens. With such a configuration, the difference between the sensitivities of the plurality of photoelectric conversion units can be reduced, and thus the accuracy in measuring the distance is improved.

In addition, a configuration may be such that a single ranging pixel includes a plurality of photoelectric conversion units that divide an incident light beam in the X-direction and a plurality of photoelectric conversion units that divide an incident light beam in the Y-direction. Even in such a case, it is sufficient if the area of the photoelectric conversion unit disposed on a side of the center axis of the ranging pixel that is in a direction opposite to the projection shift direction of a microlens is greater than the area of the photoelectric conversion unit disposed on another side of the center axis of the ranging pixel that is in a direction identical to the projection shift direction of the microlens. Alternatively, control electrodes may be provided for achieving a configuration in which the effective area of the photoelectric conversion unit disposed on a side of the center axis of the ranging pixel that is in a direction opposite to the projection shift direction of a microlens is greater than the effective area of the photoelectric conversion unit disposed on another side of the center axis of the ranging pixel that is in a direction identical to the projection shift direction of the microlens.

In addition, the exemplary embodiments described above may be combined as appropriate, if applicable.

According to the present invention, the distance can be measured with high accuracy even in a peripheral region of a solid-state image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-025835, filed Feb. 13, 2014, which is hereby incorporated by reference herein in its entirety.

What is claimed is:

1. A solid-state image sensor comprising one or more ranging pixels, the one or more ranging pixels each including a microlens, a plurality of photoelectric conversion units, and a plurality of waveguides disposed between the microlens and the plurality of photoelectric conversion units so as to correspond to the plurality of photoelectric conversion units,
    wherein, in at least one ranging pixel located in a peripheral region of the solid-state image sensor,
    the microlens is so disposed that a center axis thereof is shifted relative to a center axis of the ranging pixel,
    the plurality of photoelectric conversion units include a first photoelectric conversion unit and a second photoelectric conversion unit,
    the first photoelectric conversion unit is disposed on a side of the center axis of the ranging pixel that is in a direction opposite to a direction obtained by projecting a shift direction of the microlens onto a straight line connecting a center of the first photoelectric conversion unit and a center of the second photoelectric conversion unit,
    the second photoelectric conversion unit is disposed on another side of the center axis of the ranging pixel that is in a direction identical to the direction obtained by projecting the shift direction of the microlens onto the straight line, and
    an area of the first photoelectric conversion unit on a light-incident side of the ranging pixel is greater than an area of the second photoelectric conversion unit on the light-incident side.

2. The solid-state image sensor according to claim 1, wherein, in the at least one ranging pixel, a width of the first photoelectric conversion unit in an array direction in which the first photoelectric conversion unit and the second photoelectric conversion unit are arrayed is greater than a width of the second photoelectric conversion unit in the array direction.

3. The solid-state image sensor according to claim 1, wherein at least two ranging pixels in which shift amounts of corresponding microlenses differ from each other are disposed in the peripheral region, and
    a value representing a ratio of the area of the first photoelectric conversion unit on the light-incident side to the area of the second photoelectric conversion unit on the light-incident side is greater in one of the at least two ranging pixels in which the shift amount of the microlens is greater than in another one of the at least two ranging pixels in which the shift amount of the microlens is smaller.

4. The solid-state image sensor according to claim 1, wherein the one or more ranging pixels include a plurality of distance measuring pixels, and
    a sum of the areas of the plurality of photoelectric conversion units on the light-incident side provided in each of the ranging pixels is constant among the plurality of ranging pixels.

5. The solid-state image sensor according to claim 1, wherein the microlens is shifted toward a center of the solid-state image sensor.

6. The solid-state image sensor according to claim 1, wherein the peripheral region is a region that is spaced apart from a center of the solid-state image sensor by a distance that is no less than 0.4 times a length of a diagonal line of the solid-state image sensor.

7. The solid-state image sensor according to claim 1, wherein, in at least two ranging pixels located in the peripheral region, a shift amount of the microlens in one of the at least two ranging pixels that is farther from a center of the solid-state image sensor is greater than the shift amount of the microlens in another one of the at least two ranging pixels that is closer to the center of the solid-state image sensor.

8. The solid-state image sensor according to claim 1, further comprising:
    a ranging pixel in which a microlens is disposed so as to be coaxial with the ranging pixel.

9. The solid-state image sensor according to claim 1, further comprising:
    a ranging pixel in which the shift direction of the microlens is orthogonal to an array direction in which the plurality of waveguides are arrayed,
    wherein, in the ranging pixel in which the shift direction and the array direction are orthogonal to each other, the areas of the plurality of photoelectric conversion units on the light-incident side are equal to each other.

10. The solid-state image sensor according to claim 1, wherein the ranging pixel is also provided in a central region of the solid-state image sensor.

11. The solid-state image sensor according to claim 1, further comprising:
    an image-capturing pixel that includes a microlens, a single photoelectric conversion unit, and a single waveguide disposed between the microlens and the single photoelectric conversion unit.

12. An image-capturing device, comprising:
    the solid-state image sensor according to claim 1; and
    an imaging optical system disposed closer to a light-incident side of the image-capturing device than the solid-state image sensor.

13. The solid-state image sensor according to claim 1, wherein the center axis of the microlens corresponds to the optical axis of the microlens, and the center axis of the ranging pixel corresponds to an axis that passes through the center of the ranging pixel and that extends along, between or through at least the microlens and at least one of: at least one waveguide of the plurality of waveguides and one of the first photoelectric conversion unit and the second photoelectric conversion unit.

14. The solid-state image sensor according to claim 2, wherein, in the at least one ranging pixel, a width of the first photoelectric conversion unit in a non-array direction in which the first photoelectric conversion unit and the second photoelectric conversion unit are not arrayed is the same as or equal to a width of the second photoelectric conversion unit in the non-array direction.

15. The solid-state image sensor according to claim 1, wherein, in at least another ranging pixel located in a peripheral region of the solid-state image sensor that is different than the peripheral region in which the at least one ranging pixel is located, the microlens of the at least another ranging pixel is: (i) so disposed that a center axis of the microlens of the at least another ranging pixel is shifted relative to a center axis of the at least another ranging pixel; and (ii) shifted in a direction opposite to the shift direction of the microlens of the at least one ranging pixel.

16. A solid-state image sensor comprising one or more ranging pixels, the one or more ranging pixels each including a microlens, a plurality of photoelectric conversion units, and a plurality of waveguides disposed between the microlens and the plurality of photoelectric conversion units so as to correspond to the plurality of photoelectric conversion units,
wherein, in at least one ranging pixel located in a peripheral region of the solid-state image sensor,
the microlens is so disposed that a center axis thereof is shifted relative to a center axis of the ranging pixel,
the plurality of photoelectric conversion units include a first photoelectric conversion unit and a second photoelectric conversion unit,
the first photoelectric conversion unit is disposed on a side of the center axis of the ranging pixel that is in a direction opposite to a direction obtained by projecting a shift direction of the microlens onto a straight line connecting a center of the first photoelectric conversion unit and a center of the second photoelectric conversion unit, and
the second photoelectric conversion unit is disposed on another side of the center axis of the ranging pixel that is in a direction identical to the direction obtained by projecting the shift direction of the microlens onto the straight line, and
wherein the solid-state image sensor includes at least one of a first electrode to which a bias serving as attractive force between the first electrode and a carrier accumulated in the first photoelectric conversion unit is applied and a second electrode to which a bias serving as repulsive force between the second electrode and the carrier is applied.

17. The solid-state image sensor according to claim 16, wherein the solid-state image sensor includes both the first electrode and the second electrode.

18. The solid-state image sensor according to claim 16, wherein at least one of the first and second electrodes is disposed on a side of the plurality of photoelectric conversion units where the plurality of waveguides are disposed, in a direction in which light is incident.

19. The solid-state image sensor according to claim 16, wherein at least one of the first and second electrodes is disposed on a side of the plurality of photoelectric conversion units that is opposite to a side where the plurality of waveguides are disposed, in a direction in which light is incident.

20. The solid-state image sensor according to claim 16, wherein the center axis of the microlens corresponds to the optical axis of the microlens, and the center axis of the ranging pixel corresponds to an axis that passes through the center of the ranging pixel and that extends along, between or through at least the microlens and at least one of: at least one waveguide of the plurality of waveguides and one of the first photoelectric conversion unit and the second photoelectric conversion unit.

21. The solid-state image sensor according to claim 16, wherein, in the at least one ranging pixel:
(i) a width of the first photoelectric conversion unit in an array direction in which the first photoelectric conversion unit and the second photoelectric conversion unit are arrayed is greater than a width of the second photoelectric conversion unit in the array direction; and
(ii) a width of the first photoelectric conversion unit in a non-array direction in which the first photoelectric conversion unit and the second photoelectric conversion unit are not arrayed is the same as or equal to a width of the second photoelectric conversion unit in the non-array direction.

22. The solid-state image sensor according to claim 16, wherein, in at least another ranging pixel located in a peripheral region of the solid-state image sensor that is different than the peripheral region in which the at least one ranging pixel is located, the microlens of the at least another ranging pixel is: (i) so disposed that a center axis of the microlens of the at least another ranging pixel is shifted relative to a center axis of the at least another ranging pixel; and (ii) shifted in a direction opposite to the shift direction of the microlens of the at least one ranging pixel.

23. A solid-state image sensor comprising one or more pixels, the one or more pixels each including a microlens, a plurality of photoelectric conversion units, and a plurality of waveguides disposed between the microlens and the plurality of photoelectric conversion units so as to correspond to the microlens and the plurality of photoelectric conversion units,
wherein, in at least one pixel located in a peripheral region of the solid-state image sensor,
the microlens is so disposed that an optical axis thereof is shifted relative to a center axis of the pixel,
the plurality of photoelectric conversion units include a first photoelectric conversion unit and a second photoelectric conversion unit,
the first photoelectric conversion unit is disposed on a side of the second photoelectric conversion unit that is in a direction opposite to a direction obtained by projecting a shift direction of the microlens onto a straight line connecting a center of the first photoelectric conversion unit and a center of the second photoelectric conversion unit, and
an area of the first photoelectric conversion unit on a light-incident side of the pixel is greater than an area of the second photoelectric conversion unit on the light-incident side.

24. A solid-state image sensor comprising one or more pixels, the one or more pixels each including a microlens, a plurality of photoelectric conversion units, and a plurality of waveguides disposed between the microlens and the plurality of photoelectric conversion units so as to correspond to the microlens and the plurality of photoelectric conversion units,
wherein, in at least one pixel located in a peripheral region of the solid-state image sensor,
the microlens is so disposed that an optical axis thereof is shifted relative to a center axis of the pixel, the plurality of photoelectric conversion units include a first photoelectric conversion unit and a second photoelectric conversion unit, the first photoelectric conversion unit is disposed on a side of the second photoelectric conversion unit that is in a direction opposite to a direction obtained by projecting a shift direction of the microlens onto a straight line connecting a center of the first photoelectric conversion unit and a center of the second photoelectric conversion unit, and wherein the solid-state image sensor includes at least one of a first electrode to which a bias serving as attractive force between the first electrode and a carrier accumulated in the first photoelectric conversion unit is applied and a second electrode to which a bias serving as repulsive force between the second electrode and the carrier is applied.

\* \* \* \* \*